(12) United States Patent
Butendeich et al.

(10) Patent No.: US 9,746,141 B2
(45) Date of Patent: Aug. 29, 2017

(54) LIGHT-EMITTING DIODE ARRANGEMENT FOR GENERATING WHITE LIGHT

(71) Applicant: OSRAM OPTO SEMICONDUCTORS GMBH, Regensburg (DE)

(72) Inventors: Rainer Butendeich, Regensburg (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 67 days.

(21) Appl. No.: 14/423,026

(22) PCT Filed: Aug. 20, 2013

(86) PCT No.: PCT/EP2013/067316
§ 371 (c)(1),
(2) Date: Feb. 20, 2015

(87) PCT Pub. No.: WO2014/029773
PCT Pub. Date: Feb. 27, 2014

(65) Prior Publication Data
US 2015/0252962 A1    Sep. 10, 2015

(30) Foreign Application Priority Data
Aug. 21, 2012    (DE) .................. 10 2012 214 828

(51) Int. Cl.
*F21V 9/00*    (2015.01)
*F21K 99/00*    (2016.01)
(Continued)

(52) U.S. Cl.
CPC ............... *F21K 9/56* (2013.01); *F21K 9/64* (2016.08); *F21V 9/16* (2013.01); *H01L 25/0753* (2013.01);
(Continued)

(58) Field of Classification Search
CPC ...... F21K 9/56; F21K 9/64; F21V 9/16; H01L 25/0753; H01L 33/504; H01L 2924/0002;
(Continued)

(56) References Cited

U.S. PATENT DOCUMENTS 7,564,180 B2    7/2009    Brandes
2004/0021629 A1    2/2004    Sasuga
(Continued)

FOREIGN PATENT DOCUMENTS

DE    10 2010 002 332    6/2011
DE    10 2010 034 915    2/2012
(Continued)

*Primary Examiner* — Elmito Breval
*Assistant Examiner* — Hana Featherly
(74) *Attorney, Agent, or Firm* — Cozen O'Connor

(57) ABSTRACT

An arrangement (1) for generating white light (5), having at least two light-emitting diodes, wherein the first diode (2) is designed to generate blue light, wherein a conversion element (4) is associated with the first diode, wherein the conversion element is designed to convert a part of the blue light from the first diode into green light, and wherein the conversion element is designed to convert a part of the blue light from the first diode into red light, wherein the second diode (3) is provided to emit red light.

8 Claims, 4 Drawing Sheets

(51) Int. Cl.
*H01L 25/075* (2006.01)
*H01L 33/50* (2010.01)
*H05B 33/14* (2006.01)
*F21V 9/16* (2006.01)
*F21K 9/64* (2016.01)
*F21Y 115/10* (2016.01)
*F21Y 113/13* (2016.01)

(52) U.S. Cl.
CPC ........... *H01L 33/504* (2013.01); *H05B 33/14* (2013.01); *F21Y 2113/13* (2016.08); *F21Y 2115/10* (2016.08); *H01L 2924/0002* (2013.01)

(58) Field of Classification Search
CPC ... H05B 33/14; F21Y 2113/13; F21Y 2115/10
USPC ........................................................ 362/231
See application file for complete search history.

(56) References Cited

U.S. PATENT DOCUMENTS

| | | | |
|---|---|---|---|
| 2004/0027481 A1* | 2/2004 | Asai | H04N 5/2256 348/372 |
| 2005/0099808 A1 | 5/2005 | Cheng et al. | |
| 2009/0243457 A1 | 10/2009 | Jung et al. | |
| 2011/0273079 A1 | 11/2011 | Pickard et al. | |
| 2012/0242245 A1 | 9/2012 | Pachler | |

FOREIGN PATENT DOCUMENTS

| | | |
|---|---|---|
| EP | 2 365 525 | 9/2011 |
| JP | 2011-066108 | 3/2011 |
| WO | WO 2011/044931 | 4/2011 |

\* cited by examiner

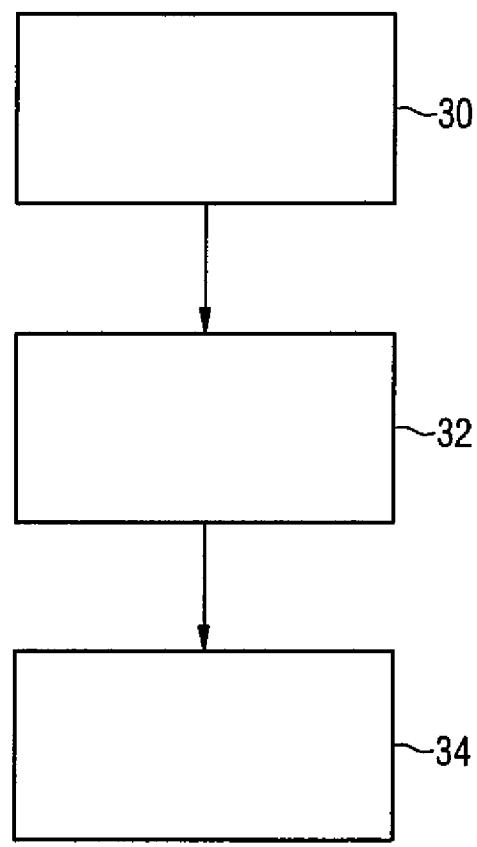

LIGHT-EMITTING DIODE ARRANGEMENT FOR GENERATING WHITE LIGHT

RELATED APPLICATIONS

This is a U.S. National Phase Application under 35 USC 371 of International Application PCT/JP2013/069463 filed on Jul. 18, 2013.

This application claims the priority of Japanese application no. 2012-176943 filed Aug. 9, 2012, the entire content of which is hereby incorporated by reference.

FIELD OF THE INVENTION

The invention relates to an arrangement for generating white light having light-emitting diodes, and to a method for producing an arrangement having light-emitting diodes.

BACKGROUND OF THE INVENTION

The process of generating a white light by means of a red LED and a blue LED with additional phosphor for a green component is known in the prior art.

In addition to selecting the wavelengths of the LEDs, it is necessary to match the LEDs with one another in a suitable manner in terms of the luminous fluxes. A failure to match the luminous fluxes of the LEDs can be compensated for by selective electrical actuation which is, however, relatively costly.

The arrangement described can only be produced with specially designed and selected LEDs, wherein some of the LEDs produced cannot be used due to the unsuitable luminous fluxes.

SUMMARY OF THE INVENTION

One object of the invention is to provide an arrangement, with which light-emitting diodes (LEDs), including those having greater differences in luminous flux, i.e. differences in brightness, can be installed.

Another object of the invention is to provide a method for producing an arrangement having two LEDs, wherein LEDs which do not match one another precisely in terms of the luminous fluxes, i.e. the brightness ratios, can also be used.

These and other objects are attained in accordance with one aspect of the present invention directed to a method for producing an arrangement having at least two light-emitting diodes, wherein the first diode is adapted to emit blue light, wherein the second diode is adapted to emit red light, wherein the first diode and the second diode are selected from a multiplicity of first and second diodes in terms of a predetermined luminous flux, wherein the luminous flux of the second diode is too small to achieve a desired white colour point with the light from the two diodes, wherein the first diode is provided with a conversion element, wherein the conversion element is adapted to convert a part of the blue light from the first diode into green light and to convert a part of the blue light from the first diode into red light, so that the lack of luminous flux of the second diode is compensated for, in order to achieve the desired white colour point with the aid of the light radiation from the two diodes, and wherein the first diode having the conversion element and the second diode are installed on an arrangement for generating white light.

Another aspect of the present invention is directed to a method for producing an arrangement having at least two light-emitting diodes, wherein the first diode is adapted to emit blue light, wherein the second diode is adapted to emit red light, wherein the first diode and the second diode are selected from a multiplicity of first and second diodes in terms of a predetermined luminous flux, wherein the luminous flux of the second diode is too small to achieve a desired white colour point with the light from the two diodes, wherein the first diode is provided with a conversion element, wherein the conversion element is adapted to convert a part of the blue light from the first diode into green light and to convert a part of the blue light from the first diode into red light, so that the lack of luminous flux of the second diode is compensated for, in order to achieve the desired white colour point with the aid of the light radiation from the two diodes, and wherein the first diode having the conversion element and the second diode are installed on an arrangement for generating white light.

The arrangement described and the method described have the advantage that a larger part of the available LEDs can be installed for an arrangement for generating white light.

The arrangement described and the method described have the advantage that differences in brightness between LEDs, which would not result in a desired colour point in the region of the Planck curve, are compensated for by a corresponding conversion element, in that a part of the blue light from the first diode is converted into red light in the conversion element.

Differences in luminous flux, i.e. differences in brightness, of the LEDs can be compensated for by means of appropriate adjustments to the conversion element.

With the aid of the arrangement described and the method described, a larger part of the LEDs with different brightness distributions resulting during the production of the LEDs can be used, in order to produce an arrangement having one red LED and at least one blue LED, which generates white light.

A simple and inexpensive conversion element is obtained by using green phosphor and/or red phosphor, in order to convert the blue light from the first diode into green and/or into red light. The use of red and green phosphor is a known technique which can be performed simply and inexpensively.

The arrangement described and the method described have the advantage that faint red LEDs can be used. This is achieved by designing the conversion element of the blue LED in such a way that the light emitted by the conversion element has a colour point in a colour chart, which is located between a conversion straight line of the green phosphor and the Planck curve. A CIE 1931 chromaticity diagram is used as a colour chart.

In a further embodiment, many of the first and second diodes resulting during production can be used to construct the arrangement for generating white light. This is achieved by selecting the first diode and the conversion element in such a way that the light emitted by the conversion element has a colour point in a triangular region of the chromaticity diagram, wherein the triangular region is delimited by a sixth line, which can be described with the following formula: $Cy=-(2.453*Cx^2)+2.446*Cx-0.195$, and wherein the triangular region is delimited by a seventh line which can be described by the following formula: $Cy=1.478*Cx-0.110$, where Cy denotes the Y value of the chromaticity diagram and Cx denotes the X value of the chromaticity diagram.

In a further embodiment, in addition to the first diode, an additional first diode is provided, which also emits blue light and has an additional first conversion element. In this way, arrangements for generating white light can be provided with different brightness levels.

By using two first diodes, two faint first diodes which emit blue light can be used, for example, to construct an arrangement. Faint blue diodes can therefore also be installed.

One development of the invention has the advantage that it has a simple power supply. This is achieved in that the at least first diode and the second diode are connected in series to the power supply.

The arrangement described has the advantage that no selective electrical actuation of the individual diodes is required. The construction of the electrical actuation is therefore simple and inexpensive.

The simple structure of the arrangement is suited, for example, for use in a floodlight or a retrofitted fluorescent tube application.

The arrangement is particularly suitable for applications where only a few discrete diodes can be installed in one component and thus the conditions in the luminous flux strength cannot be compensated for by means of a suitable number of diodes of the respective colour.

BRIEF DESCRIPTION OF THE DRAWINGS

The properties, features and advantages of this invention, which are described above, and the manner in which they are achieved will become clearer and more easily comprehensible in connection with the following description of the exemplified embodiments, which are explained in more detail in connection with the drawings, wherein FIG. 5 shows a schematic illustration of the steps of the production method.

DETAILED DESCRIPTION OF THE DRAWINGS

Figure 1:
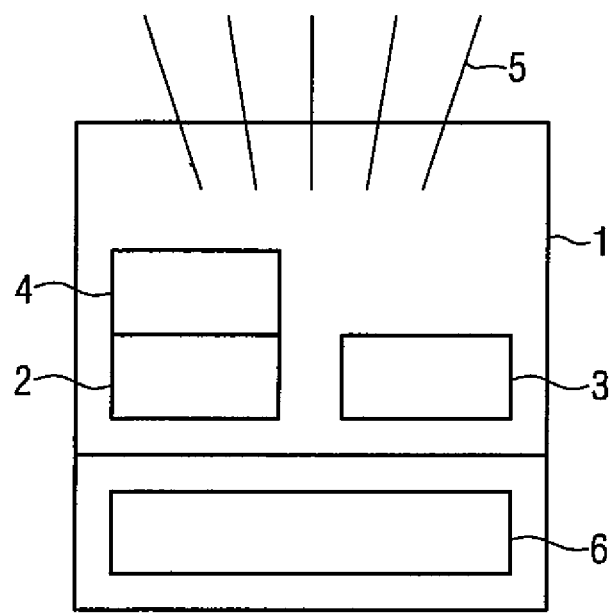
FIG. 1 shows a schematic construction of an arrangement.

FIG. 1 shows a schematic illustration of an arrangement 1 having a first diode 2 and a second diode 3. The first diode 2 has a conversion element 4. The first diode 2 is designed to emit blue light in the wavelength range between 400 and 500 nm. The conversion element 4 is designed to convert a part of the blue light into red light and a further part of the blue light into green light. In addition, the conversion element 4 allows a part of the blue light through unchanged. The term 'green light' means light which has a wavelength of between 500 and 570 nm. The term 'red light' means light which has a wavelength of between 600 and 760 nm.

The conversion element has, for example, luminescent material such as e.g. green phosphor for converting blue light into green light. In addition, the following luminescent materials can also be used: $(Sr,Ca)_2SiO_4:Eu^{2+}$; $Ba_2SiO_4:Eu^{2+}$; $SrGa_2S_4$; $ZnS:Cu+, Au+, Al^{3+}$; $(Zn, Cd)S:Ag+$; $CaS:Ce^{3+}$; $(LU, Y)_3(Al,Ga)_5O_{10}:Ce^{3+}$.

The conversion element 4 can, for example, have luminescent materials such as e.g. red phosphor for converting blue light into red light. In addition, the following materials can also be used instead of or in addition to red phosphor: $CaS:Eu,Mn$; $CaS:Eu$; $SrS:Eu$; $(Zn,Cd)S:Ag$; $(Ca,Sr,Ba)Si_5N_8:Eu^{2+}$; $(Ca,Sr)AlSiN_3:Eu^{2+}$.

The second diode 3 is designed to emit red light. The red light can be in the range between 600 and 760 nm, for example between 610 and 630 nm.

The first diode 2 can be produced, for example, from indium gallium nitride. The second diode 3 can be produced, for example, from indium gallium aluminium phosphide.

Depending on the selected embodiment a first diode having a conversion element and a second diode or two first diodes with corresponding conversion elements and a second diode can be provided in the arrangement 1.

The brightnesses of the first and second diodes 2, 3 and the light conversion properties of the conversion element 4 are designed in such a way that the light 5 emitted by the arrangement 1 constitutes white light. Light radiation, which has a colour point in a fixed area around the Planck curve of the CIE 1931 chromaticity diagram, is deemed to be white light.

Thanks to the use of the material which converts blue light into red light in the conversion element 4, combinations of the first diode and second diode can also be used, in which the brightness ratios of the second diode do not match the first diode. A too low brightness, i.e. too low a luminous flux (measured in $lumens=lux/m^2$) of the second diode 3 is compensated for by a corresponding conversion of the light from the first diode by the conversion element 4 into red light.

In addition, depending on the brightness, i.e. depending on the luminous flux of the diodes used, a plurality of first diodes 2 and/or a plurality of second diodes 3 can be used. Thus, for example, two faint first diodes 2 with conversion elements 4 can be used to generate white light 5 with a second diode 3. Likewise, a first diode having a conversion element can also be combined with a plurality of second diodes. Any number of first diodes can therefore be combined with any number of second diodes in an arrangement.

Figure 2:
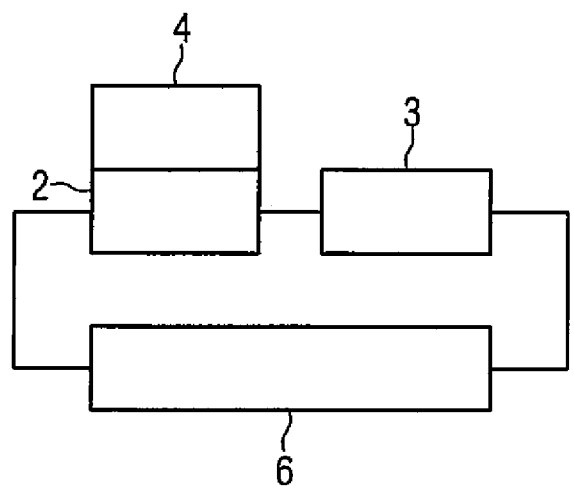
FIG. 2 shows a schematic illustration of a serial connection of the first and the second diodes.

FIG. 2 shows a schematic illustration of a simple and inexpensive electrical actuation of the first and second diode 2, 3. In the embodiment shown, the first diode 2 and the second diode 3 are connected electrically in series and are flowed through by the same current. It is therefore not necessary to actuate the individual diodes separately with the power supply 6.

Furthermore, for example, 2n first diodes 2 to 1n second diodes 3 can be used in the arrangement 1, where n is one of the whole natural numbers. In this case, all the diodes of an arrangement can be electrically connected in series.

Figure 3:
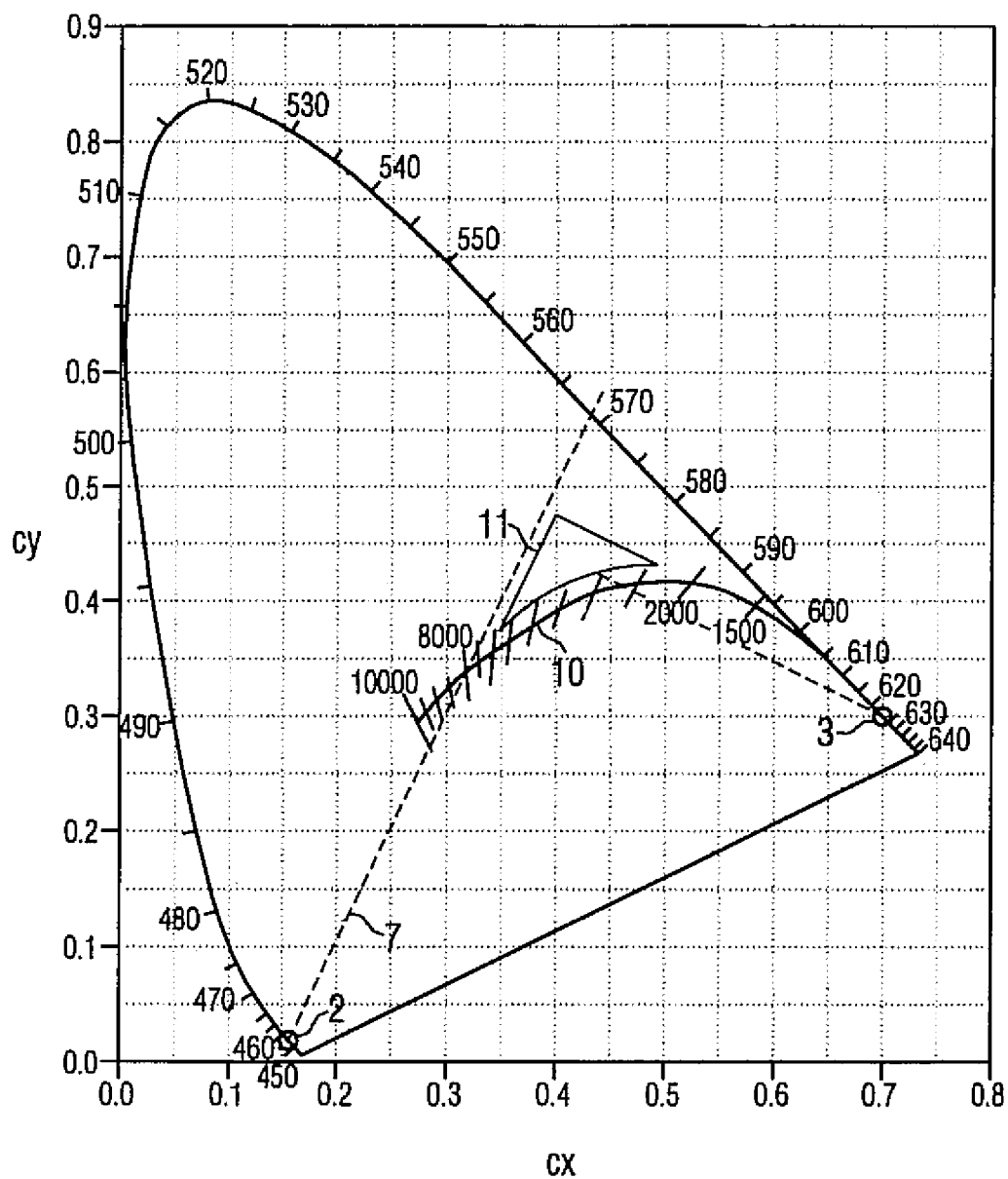
FIG. 3 shows an illustration of a CIE 1931 chromaticity diagram.

FIG. 3 shows a schematic illustration of a CIE 1931 chromaticity diagram, in which the $C_x$ values are plotted on the X axis and the $C_y$, values of the standard colour system are plotted on the Y axis. The colour space is drawn in the chromaticity diagram. The illustrated example shows a first diode 2 which emits blue light having a wavelength of 450 nm. The conversion element 4 contains green phosphor such that a conversion line 7 can be plotted. The conversion element is constructed in such a way that the light from the first diode 2 is partially converted into light having a wavelength of 568 nm. Furthermore, a second diode 3 is shown, which emits red light in the range of 630 nm. The wavelengths of the first and second diodes and the luminous fluxes of the first and second diodes should be matched in such a way that the light 5 emitted from the first and the second diodes, taking account of the conversion element 4, lies in a range on the Planckian curve 10. However, the strengths of the luminous flux of the first and second diodes are not suitable, so that due to a weaker luminous flux of the red diode, a colour point would be reached, which is located above the Planckian curve and located in the triangular area 11 shown. However, this variation cannot be accepted for a white light. Compensation for the weak luminous flux strength, i.e. low brightness, of the second diode is compensated by a corresponding luminescent material in the conversion element which converts parts of the blue light from the first diode into red light. The concentration of the luminescent material in the conversion element depends on the brightness values of the first and second diode.

Figure 4:
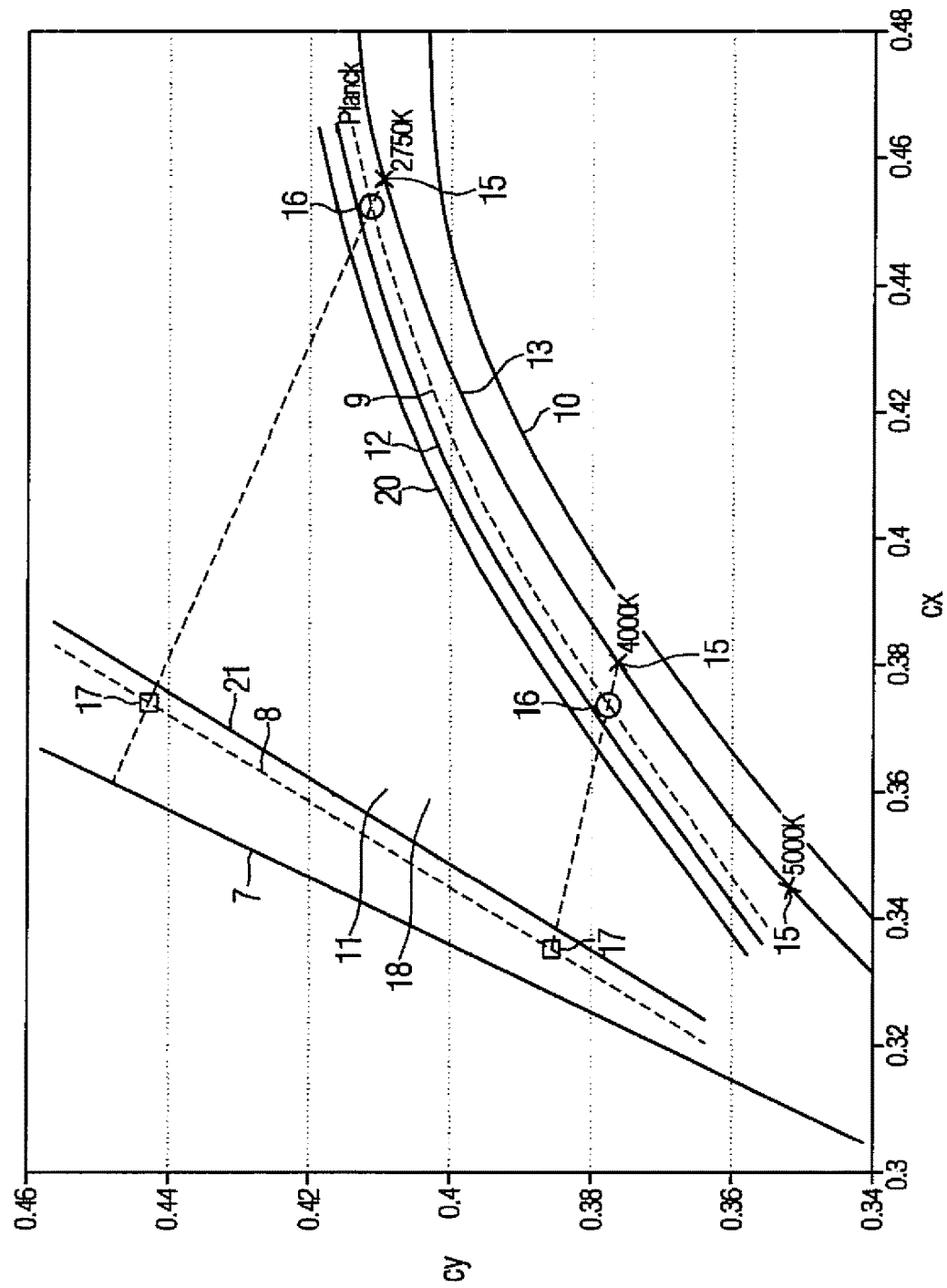
FIG. 4 shows an enlarged section of the chromaticity diagram.

FIG. 4 shows an enlarged illustration of a detail of the CIE 1931 chromaticity diagram from FIG. 3, wherein the $C_x$ values are plotted on the X axis and the $C_y$ values are plotted on the Y axis. The Planckian curve 10 is shown in the range between a colour temperature of 2,750 K and 5,000 K. The target colour point for the white light is, in each case, represented as a cross 15 on the Planckian curve 10. Typically, a certain tolerance range is accepted around a target colour point. This range is drawn in by means of a third and a fourth line 12, 13 around the Planck curve 10. The ratio of luminous flux strengths, i.e. of the brightnesses, must therefore be well matched to one another for a mixture of several diodes, so that the resulting colour point falls into the region between the third and fourth lines 12, 13. The colour point drawn in the diagram as a circle 16 is that boundary point which is produced by a red second diode with a lower than optimum luminous power and which is located just inside the third and fourth lines 12, 13 about the desired colour point. All of the other red diodes, which have a lower luminous flux strength, would, in the mixed light from the first and second diodes, lead to colour points outside the tolerance range and must therefore be compensated for by a corresponding addition of luminescent material in the conversion element of the first diode, which converts the blue light from the first diode into red light. This mixture alone results in the limiting case in the colour points identified with a square 17, generally in colour points between the dashed lines 8, 9.

A colour space for the special luminescent mixture of the conversion element of the first blue diode is therefore shown inside the two black dashed lines 8, 9, through which the conversion straight line of the conversion element runs, in order to compensate for too low a brightness of faint red second diodes. The conversion element preferably has a conversion straight line which passes through the triangle 11, which is shown between the dashed lines 8, 9 in FIG. 4. The first diode preferably has a luminous flux such that the first diode 2 having the conversion element emits a light, the colour point of which lies in a second triangular region 18.

The second triangular region 18 is delimited on one side by a sixth line 20, which runs along the Planck curve 10 and which can be described by the following formula: $Cy=-(2.453*Cx^2)+2.446*Cx-0.195$, where Cy denotes the Y value of the chromaticity diagram and Cx denotes the X value of the CIE 1931 chromaticity diagram. The second triangular region 18 is delimited on a second side by a seventh line 21, which runs alongside the conversion straight line 7 and which can be described by the following formula: $Cy=1.478*Cx-0.110$, where Cy denotes the Y value of the chromaticity diagram and Cx denotes the X value of the chromaticity diagram. Depending on the selected embodiment, a fifth line 19 can be provided, which delimits the second triangular region with respect to a maximum conversion. The fifth line 19 is only shown schematically in FIG. 4. The fifth line 19 can be described by the following formula: $Cy=-0.560*Cx+0.718$.

The location and size of the second triangular region 18 in the colour space of the chromaticity diagram can vary and depends on the wavelengths and luminous fluxes of the first and second diodes used. In addition, the location and size of the second triangular region 18 in the colour space of the chromaticity diagram depends on the wavelength of the light, which is converted by the conversion element. In addition, the location and size of the second triangular region 18 in the colour space of the chromaticity diagram depends on a percentage of the light from the first diode, which is converted by the conversion element. For example, a range for the colour space of the emitted light from the first diode in the colour space of the CIE 1931 chromaticity diagram can be delimited by the following straight line: $Cy=2.9536*Cx-0.4076$, with all colour points having a smaller Cy than through the straight line up to the Planck straight line being possible. In this evaluation, a very short-wave green luminescent substance was adopted for the conversion element.

FIG. 5 shows a schematic illustration of the steps of a method for producing an arrangement having two light-emitting diodes, with the first diode emitting a blue light and the second diode emitting a red light. At programme point 30, a first and a second diode are selected with respect to the wavelength and the luminous flux, wherein the second diode has too low a luminous flux, in order to generate a mixed white light with the first diode which has a conversion element for converting blue light into green light, the colour point of said mixed white light being located between the third and fourth lines 12, 13 of FIG. 4 in the region of the Planckian curve. Nevertheless, at programme point 32, the two diodes are located on an arrangement. At programme point 34, the first diode is provided with a conversion element which converts both a part of the blue light into green light and a part of the blue light into red light, in order to compensate for the too low luminous flux of the second diode, so that the colour point of the mixed light emitted by the arrangement is located between the third and fourth lines in the region of the Planckian curve. For this purpose, the conversion element has, for example, a conversion straight line which extends between the first and second lines. At a following programme point 36, the first and second diodes are provided with a power supply, wherein the first and second diodes are connected electrically in series in one exemplified embodiment.

Although the invention has been illustrated and described in more detail by the preferred exemplified embodiment, the invention is not limited by the disclosed examples and other variations can be derived therefrom by a person skilled in the art without departing from the scope of protection of the invention.

The invention claimed is:

1. An arrangement for generating white light, having at least two light-emitting diodes,
    wherein the first diode generates blue light,
    wherein a conversion element is associated with the first diode,
    wherein the conversion element converts a part of the blue light from the first diode into green light,
    wherein the conversion element converts a part of the blue light from the first diode into red light,
    wherein the first diode and the conversion element are adapted in such a way that the light emitted by the conversion element has a colour point in a triangular region of a chromaticity diagram, wherein the triangular region is delimited by a sixth line, which runs along the Planck curve and which can be described by the following formula:
$Cy=-(2.453*Cx^2)+2.446*Cx)-0.195$, where Cy denotes the Y value of the chromaticity diagram and Cx denotes the X value of the chromaticity diagram, and wherein the triangular region is delimited by a seventh line, which runs alongside the conversion straight line and which can be described by the following formula: $Cy=1.478*Cx-0.110$, where Cy denotes the Y value of the chromaticity diagram and Cx denotes the X value of the chromaticity diagram, and wherein the second diode emits red light.

2. The arrangement according to claim 1, wherein the conversion element comprises green phosphor.

3. The arrangement according to claim 1, wherein the at least first diode and the at least second diode are connected electrically in series to a power supply.

4. The arrangement according to claim 1, wherein the conversion element comprises red phosphor.

5. The arrangement according to claim 1, wherein the conversion element is adapted in such a way that the light emitted by the conversion element has a colour point in a chromaticity diagram, which is located between a conversion straight line of the green phosphor and the Planck curve.

6. The arrangement according to claim 1, wherein a plurality of first diodes having a first conversion element or a plurality of second diodes are provided.

7. The arrangement according to claim 1, wherein the luminous fluxes of the first and second diodes and the conversion element are adapted in such a way that the white light generated has a colour point which is located in a predetermined region around a Planck curve of a CIE 1931 chromaticity diagram.

8. The arrangement according to claim 1, wherein a plurality of first diodes having a first conversion element and a plurality of second diodes are provided.

* * * * *